United States Patent [19]
Ota

[11] Patent Number: 5,721,607
[45] Date of Patent: Feb. 24, 1998

[54] ALIGNMENT METHOD AND APPARATUS

[75] Inventor: Kazuya Ota, Tokyo, Japan

[73] Assignee: Nikon Corporation, Tokyo, Japan

[21] Appl. No.: 571,763

[22] Filed: Dec. 13, 1995

[30] Foreign Application Priority Data

Dec. 15, 1994 [JP] Japan .................................. 6-311984

[51] Int. Cl.$^6$ .................................................. H01L 21/27
[52] U.S. Cl. .............................. 355/53; 355/77; 356/399; 356/400; 250/559.3
[58] Field of Search ............................ 356/401; 250/548, 250/559.3; 355/53, 54, 50, 40, 77

[56] References Cited

U.S. PATENT DOCUMENTS

| | | | |
|---|---|---|---|
| 4,778,275 | 10/1988 | Van Den Brink et al. | 356/401 |
| 4,794,426 | 12/1988 | Nishi | 355/401 |
| 4,880,310 | 11/1989 | Nishi | 356/401 |
| 5,004,348 | 4/1991 | Magome . | |
| 5,118,953 | 6/1992 | Ota et al. | 250/548 |
| 5,214,489 | 5/1993 | Mizutani et al. | 356/401 |
| 5,231,467 | 7/1993 | Takeuchi et al. | 356/401 |
| 5,377,009 | 12/1994 | Kitaoka et al. | 356/401 |
| 5,543,921 | 8/1996 | Uzawa et al. | 356/401 |
| 5,568,257 | 10/1996 | Ota et al. | 356/401 |

Primary Examiner—R. L. Moses
Assistant Examiner—Shival Virmanl
Attorney, Agent, or Firm—Armstrong, Westerman, Hattori, McLeland & Naughton

[57] ABSTRACT

An alignment method in which a reticle and a wafer are aligned with each other by using a heterodyne alignment apparatus. The method makes it possible to minimize the time required for alignment even if a wafer beat signal varies for each shot region on the wafer. In pre-alignment of the wafer, AGC (Automatic Gain Control) of a wafer beat signal ($S_w$) is initiated when a central control system confirms that the displacement between the center of a wafer mark and the center of an irradiation region of an alignment light beam irradiated to the wafer has reached a value within $\pm \Delta L_1$ in the measuring direction (direction X) and a value within $\pm \Delta L_2$ in the non-measuring direction (direction Y) on the basis of the result of calculation by an overlap calculating system, before the displacement between the reticle and a grating-shaped wafer mark reaches a value within $\pm \frac{1}{4}$ of a grating pitch ($P_w$).

15 Claims, 12 Drawing Sheets

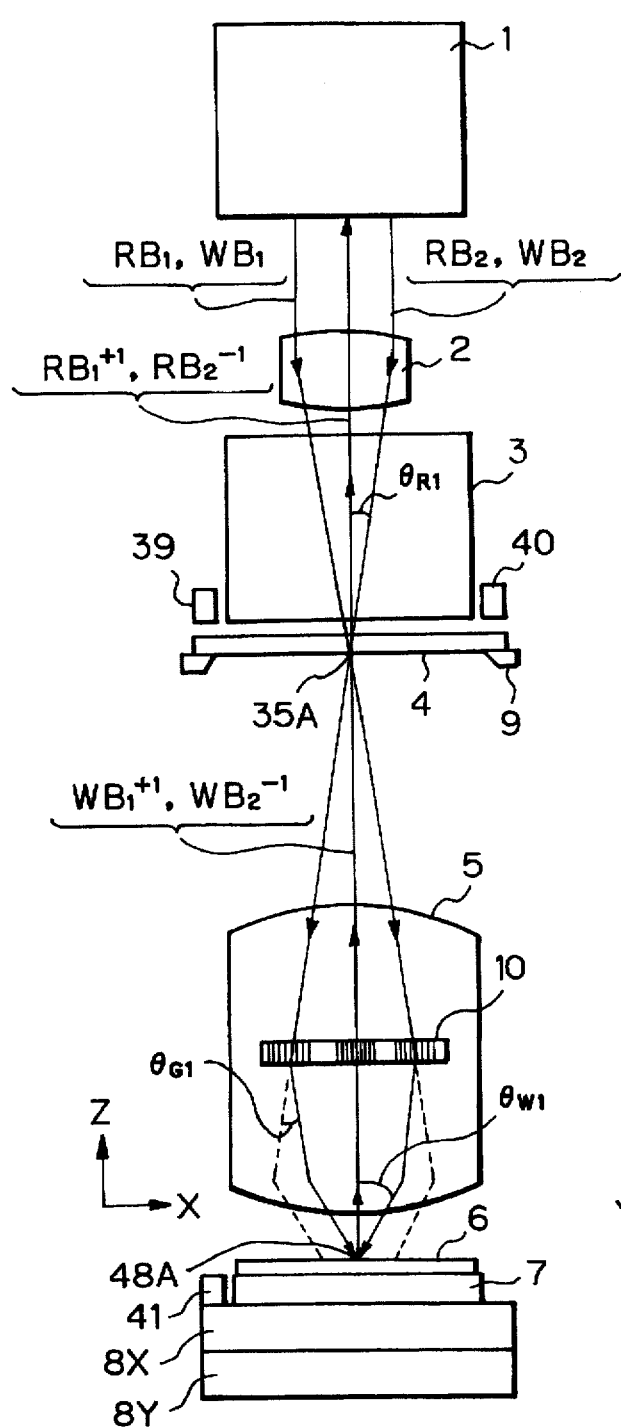
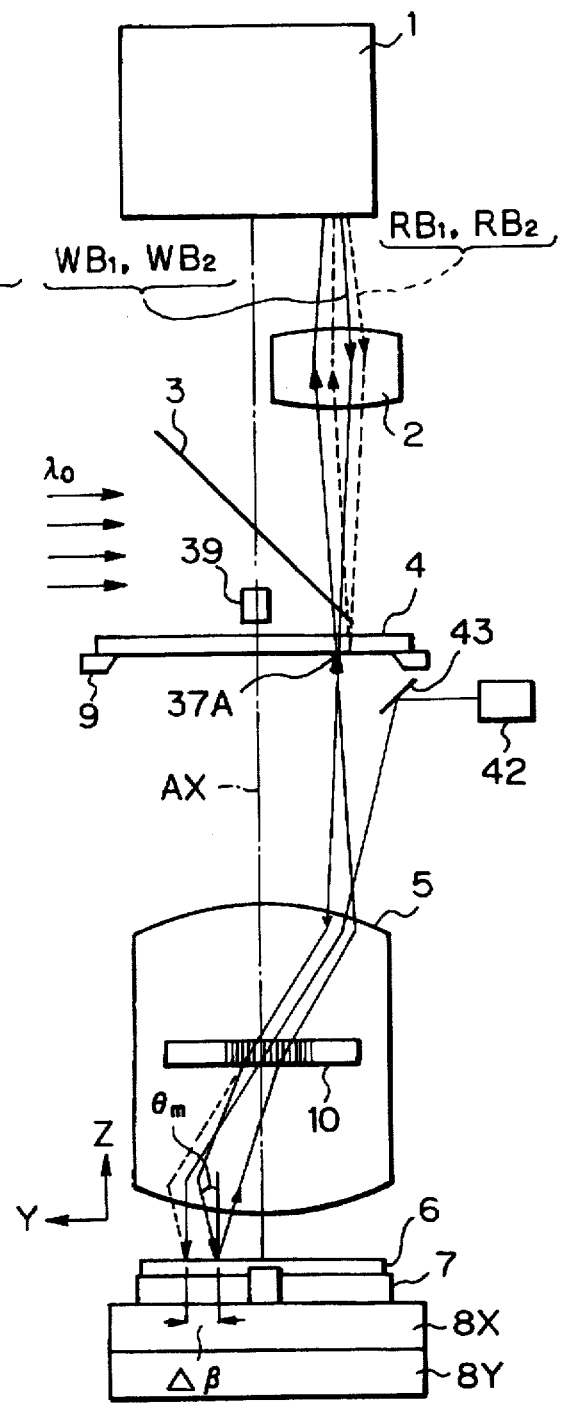
Fig. 3a
Fig. 3b

ALIGNMENT METHOD AND APPARATUS

BACKGROUND OF THE INVENTION

1. Field of the Invention

The present invention relates to an alignment method and an alignment apparatus for use in an exposure system which transfers a pattern formed on a mask onto a photosensitive substrate, to effect alignment of the mask and the photosensitive substrate. More particularly, the present invention relates to an alignment method and an alignment apparatus which are suitably applied to a process in which a relative positional relationship between a mask and a photosensitive substrate is detected by heterodyne interferometry.

2. Description of the Related Art

In a projection exposure apparatus used to produce semiconductor devices, liquid crystal display devices, etc., the accuracy of registration between a multiplicity of circuit pattern layers formed on a wafer (or a glass plate, etc.) must be maintained at a high level. Therefore, it is desired to align a reticle (or a photomask, etc.) and a wafer with each other with high accuracy, particularly when a pattern formed on the reticle is to be transferred to a second or subsequent layer on the wafer. Accordingly, a projection exposure apparatus is provided with an alignment system (alignment apparatus) for accurately detecting a positional relationship between the reticle and the wafer and for aligning them with each other.

There are various types of alignment sensors usable in alignment systems: one of which is an LSA (Laser Step Alignment) type in which a laser beam is irradiated toward an alignment mark (wafer mark) on a wafer, and the position of the wafer mark is detected on the basis of the beam which is diffracted or scattered by the wafer mark; another is an FIA (Field Image Alignment) type in which an image of an alignment mark is taken by illuminating it with light having a wide wave band emitted from a halogen lamp as a light source and the position of the alignment mark is measured by processing the obtained image; yet another is a heterodyne interferometry type in which a diffraction grating-shaped wafer mark on a wafer is irradiated from two directions with laser beams having slightly different frequencies, and the position of the wafer mark is measured on the basis of the phase of two beat signals obtained by photoelectrically converting two diffracted beams (heterodyne beams) generated from the wafer mark. The heterodyne interferometry type is also known as "LIA (Laser Interferometric Alignment) type.

Alignment systems can be roughly divided into a TTL (Through-The-Lens) type in which the positional relationship between a reticle and a wafer is measured through a projection optical system, and a TTR (Through-The-Reticle) type in which the positional relationship between a reticle and a wafer is measured through a projection optical system and the reticle. An alignment system of the TTR type is capable of realizing the highest accuracy in theory under existing circumstances.

By applying an alignment sensor using a heterodyne interferometry to such an alignment system of a TTR type, an alignment system of extremely high accuracy can be realized (for example, see Japanese Laid-Open Patent Publication No. Hei 2-272305).

In this alignment system, alignment is carried out as follows: Let us assume that ± (positive or negative) first-order diffracted beams from diffraction grating-shaped reticle and wafer marks are used, and the grating pitch of the wafer mark in a direction for measurement is $P_W$. If the wafer mark moves by $\pm P_W/4$ in the measuring direction relative to the position at which the phase difference between two beat signals obtained from the two marks reaches zero (or a predetermined target value x), the phase difference changes by $\pm 180°$. The phase difference between the two beat signals can be detected only in the range of $\pm 180°$ or in the width range of $360°$ in theory. Accordingly, if the target phase difference between the two beat signals is assumed to be $0°$, it is necessary, in order to carry out accurate alignment by using the heterodyne interferometry, to align the wafer mark for the relevant shot area or region on the wafer with the corresponding reticle mark within the range of $\pm ¼$ pitch by using an extra wafer alignment sensor. Therefore, the conventional practice is to detect the position of the wafer mark by using a known pre-alignment sensor of, for example, the above-described FIA or LSA type, and carry out pre-alignment of the wafer on the basis of the result of detection of the wafer mark position.

FIG. 16 is a flowchart showing a conventional alignment process from the start of pre-alignment to an alignment (fine alignment) of heterodyne interferometry type. As shown in FIG. 16, during pre-alignment, a wafer stage with a wafer mounted thereon is stepped at Step 201, and while so doing, the position of a reticle and the position of the wafer are measured by a position measuring system, e.g. laser interferometers, and an amount of relative displacement between the reticle and the wafer is detected by a pre-alignment sensor. Then, it is judged at Step 202 whether or not positioning has been effected so that the amount of displacement is within $\pm ¼$ of the grating pitch $P_W$ of the diffraction grating-shaped wafer mark. If the relative displacement between the reticle and the wafer is not within $\pm ¼$ of the grating pitch $P_W$, the wafer stage is further moved. If the relative displacement between the reticle and the wafer is within $\pm ¼$ of the grating pitch $P_W$, the wafer stage is stopped at Step 203. Upon completion of Step 203, the pre-alignment terminates.

After the pre-alignment is terminated, fine alignment (final alignment) by an alignment system of heterodyne interferometry type is started. However, before the initiation of the fine alignment, the amplitude of a beat signal (wafer beat signal) obtained from the wafer mark through a variable amplifier is adjusted by automatic gain control (AGC) at Step 204.

That is, a semiconductor wafer is produced through many processes such as etching and sputtering, and a photo-resist provided thereon involves coating unevenness. Therefore, all wafer marks formed on the wafer are not always uniform. More specifically, the wafer marks may be nonuniform in level, or the thickness of the resist layer may be nonuniform. In such a case, the intensity of diffracted light from each wafer mark is not always the same. Variation in the intensity of diffracted light for each mark gives rise to a problem: If there is an exceedingly large difference in intensity between diffracted light from a wafer mark of the preceding shot area or region and diffracted light from a wafer mark of the present shot area or region, for example, the beat signal obtained may be saturated or excessively small. In such a case, it may be impossible for a phase comparator to make a phase comparison between the wafer beat signal and a beat signal (reticle beat signal) obtained from an associated reticle mark. Therefore, the electrical amplification factor for the beat signal is usually changed by AGC before the initiation of fine alignment, and after an optimal signal amplitude has been obtained, the final alignment is initiated.

First, at Steps 205 and 206, a reticle stage with the reticle placed thereon is moved while a phase difference between the reticle and wafer beat signals is being detected, and it is judged whether or not the phase difference between the two signals is within a predetermined allowable range. If the phase difference between the two signals is not within the predetermined allowable range, the reticle stage is further moved. If the phase difference between the two signals is within the predetermined allowable range, the reticle stage is stopped at Step 207. Upon completion of Step 207, fine alignment terminates. At the subsequent Step 208, the reticle is irradiated with exposure light, and a circuit pattern formed on the reticle is transferred onto the wafer.

As has been described above, in the alignment system of heterodyne interferometry type, since the detectable range is within ±¼ of the grating pitch, the final alignment by the alignment system of heterodyne interferometry type is initiated after it has been confirmed that the relative displacement between the reticle and the wafer is within ±¼ of the grating pitch by a combination of a laser interferometer for the reticle and a laser interferometer for the wafer, that is, after the termination of the pre-alignment. In addition, since the conditions of the wafer marks vary according to the shot areas, as described above, the electrical amplification factor for the wafer beat signal must be adjusted by AGC after the termination of the pre-alignment. Accordingly, the start of the final alignment is delayed by a period of time required for the AGC process, causing the throughput (productivity) to be reduced.

SUMMARY OF THE INVENTION

An object of the present invention is to provide an alignment method which makes it possible to minimize the time required for alignment effected by using an alignment system of heterodyne interferometry type even if the wafer beat signal varies for each shot area on the wafer.

Another object of the present invention is to provide an alignment apparatus capable of carrying out the above-described alignment method.

The alignment method of the present invention may be applied to an alignment process in which, when a pattern formed on a mask is to be transferred onto a photosensitive substrate, a position of at least either one of the mask and the substrate is adjusted so that an amount of relative displacement between a reference mark and a substrate mark formed on the substrate reaches a predetermined target value.

The first alignment method, according to the present invention, for adjusting a relative position between a first mark and a second mark formed on a substrate, comprises the steps of: irradiating two coherent light beams having different frequencies from each other to said first and second marks, respectively; photoelectrically converting heterodyne beams produced by said first and second marks, respectively, to obtain first and second beat signals; adjusting said second beat signal with a variable amplification factor; comparing a phase difference between said first beat signal and said adjusted second beat signal; and initiating an adjusting operation of said second beat signal when the relative position between said first mark and said second mark is adjusted and before an amount of displacement between said first and second marks reaches a predetermined value.

The alignment method as described above may further include a pre-alignment sensor for detecting relative positional displacement between said first and second marks, wherein the relative position between said first and second marks may be adjusted on the basis of detected results by said pre-alignment sensor so that the amount of displacement between said first and second marks reaches said predetermined value.

In the alignment method as described above, the adjusting operation may be initiated after an irradiation region of said two coherent light beams which are irradiated on said substrate overlaps with said substrate marks more than a predetermined degree.

The second alignment method, according to the present invention, for adjusting a relative position between a first mark and a second mark formed on a substrate, comprises: a first step of pre-aligning the relative position of said first mark and said second mark formed on the substrate; a second step of irradiating alignment lights to first and second marks, respectively; a third step of photoelectrically converting light returned from said second mark to obtain a photoelectric signal; a fourth step of bringing the amount of relative displacement between said first and second marks close to a predetermined target value on the basis of said photoelectric signal; and a fifth step of adjusting the magnitude of said photoelectric signal prior to said fourth step.

The substrate mark may be formed so that it differs in size from the irradiation region of the two coherent light beams by $2\Delta L_1$ in a measuring direction (direction X) in which gratings constituting the substrate mark are arranged, and by $2\Delta L_2$ in a non-measuring direction (direction Y) which is perpendicular to the measuring direction. In this case, the irradiation region and the substrate mark overlap each other more than a predetermined degree when the amount of displacement between the center of the substrate mark and the center of the irradiation region reaches a value within $\pm\Delta L_1$ in the measuring direction and a value within $\pm\Delta L_2$ in the non-measuring direction.

The reference mark may be a diffraction grating-shaped mask mark provided on the mask.

The first alignment apparatus, according to the present invention, for adjusting a relative position between a first mark and a second mark formed on a substrate, comprises: an alignment system for irradiating two coherent light beams having different frequencies from each other to said first and second marks and photoelectrically converting heterodyne beams produced by said first and second marks, respectively, to obtain first and second beat signals; an adjusting device for adjusting said second beat signal with a variable amplification factor; comparator for comparing the phase difference between said first beat signal and said adjusted second beat signal; and controller for initiating an adjusting operation of said second beat signal when the relative position between said first mark and said second mark is adjusted and before an amount of displacement between said first and second marks reaches a predetermined value.

Further, the second alignment apparatus of the present invention has: a variable amplifier for amplifying the substrate beat signal by a variable amplification factor so that the amplitude of the substrate beat signal reaches a predetermined level; a phase comparator for making a phase difference comparison between the reference beat signal and a signal obtained by amplifying the substrate beat signal in the variable amplifier; an overlap calculating device for obtaining a degree to which the substrate mark overlaps an irradiation region of the two coherent light beams irradiated to the substrate from the alignment optical system of heterodyne interferometry type; and a controller which controls the operation of at least either one of the mask and substrate stages on the basis of the results of detection by the rough alignment system and the phase comparator, and which initiates an operation of determining an amplification factor in the variable amplifier on the basis of the degree of overlap obtained by the overlap calculating device.

According to the alignment method of the present invention, the operation of determining an amplification factor in the variable amplifier is initiated after the irradiation region of the two coherent light beams and the substrate mark have overlapped with each other by more than a predetermined degree and before the amount of displacement between the reference mark and the substrate mark reaches a value at which phase comparison can be made. Accordingly, it is possible to initiate the adjustment (automatic gain control) of the amplification factor for the substrate beat signal even when the amount of displacement between the reference mark and the substrate mark has not yet reached a value within the range of $\pm\frac{1}{4}$ of the grating pitch $P_W$ of the substrate mark, which is a detectable range in the alignment system of heterodyne interferometry type, and the adjustment of the amplification factor for the substrate beat signal has already terminated by the time when the amount of displacement between the reference mark and the substrate mark reaches a value within the range of $\pm\frac{1}{4}$ of the grating pitch $P_W$. Therefore, alignment can be effected within a short time.

In the case where the substrate mark may be formed so that it differs from the irradiation region of the two coherent light beams applied to the substrate by $2\Delta L_1$ in a measuring direction (direction X) in which gratings constituting the substrate mark are arranged, and by $2\Delta L_2$ in a non-measuring direction (direction Y) which is perpendicular to the measuring direction, and the adjustment of the amplification factor for the substrate beat signal may be initiated after the amount of displacement between the center of the substrate mark and the center of the irradiation region has reached a value within $\pm\Delta L_1$ in the measuring direction and a value within $\pm\Delta L_2$ in the non-measuring direction and before the amount of displacement between the reference mark and the substrate mark reaches a value at which phase comparison can be made, for example, in the case where the substrate mark is larger in size than the irradiation region in both the measuring and non-measuring directions, the overlapped area of the reference mark and the irradiation region has already covered the whole irradiation region at the time of initiating the adjustment of the amplification factor. Accordingly, it is possible to obtain the same diffracted light intensity as that obtained in the final alignment, and hence possible to adjust the amplification factor even more accurately.

In a case where the substrate mark is smaller in size than the irradiation region in both the measuring and non-measuring directions also, the whole substrate mark has already been within the irradiation region at the time of initiating the adjustment of the amplification factor. Therefore, the amplification factor for the substrate beat signal can be accurately adjusted.

In a case where the reference mark is a diffraction grating-shaped mask mark provided on the mask, an amount of displacement between the mask and the substrate can be directly detected without need of a special structure for providing reference gratings.

Further, the alignment apparatus of the present invention can directly carry out the above-described alignment method of the present invention.

BRIEF DESCRIPTION OF THE DRAWINGS

FIG. 1 is a view explaining the relation among

FIG. 3(a) is a front view mainly showing a stage system and an alignment optical system in the projection exposure apparatus used in the embodiment of the present invention, and FIG. 3(b) is a side view of the optical system shown in FIG. 3(a).

DESCRIPTION OF THE PREFERRED EMBODIMENTS

One embodiment of the present invention will be described below with reference to FIGS. 1 to 14. In this embodiment, the present invention is applied to an alignment system of a TTR and heterodyne interferometry type used in a projection exposure apparatus in which a pattern formed on a reticle is transferred to each shot region on a wafer through a projection optical system.

Figure 2:
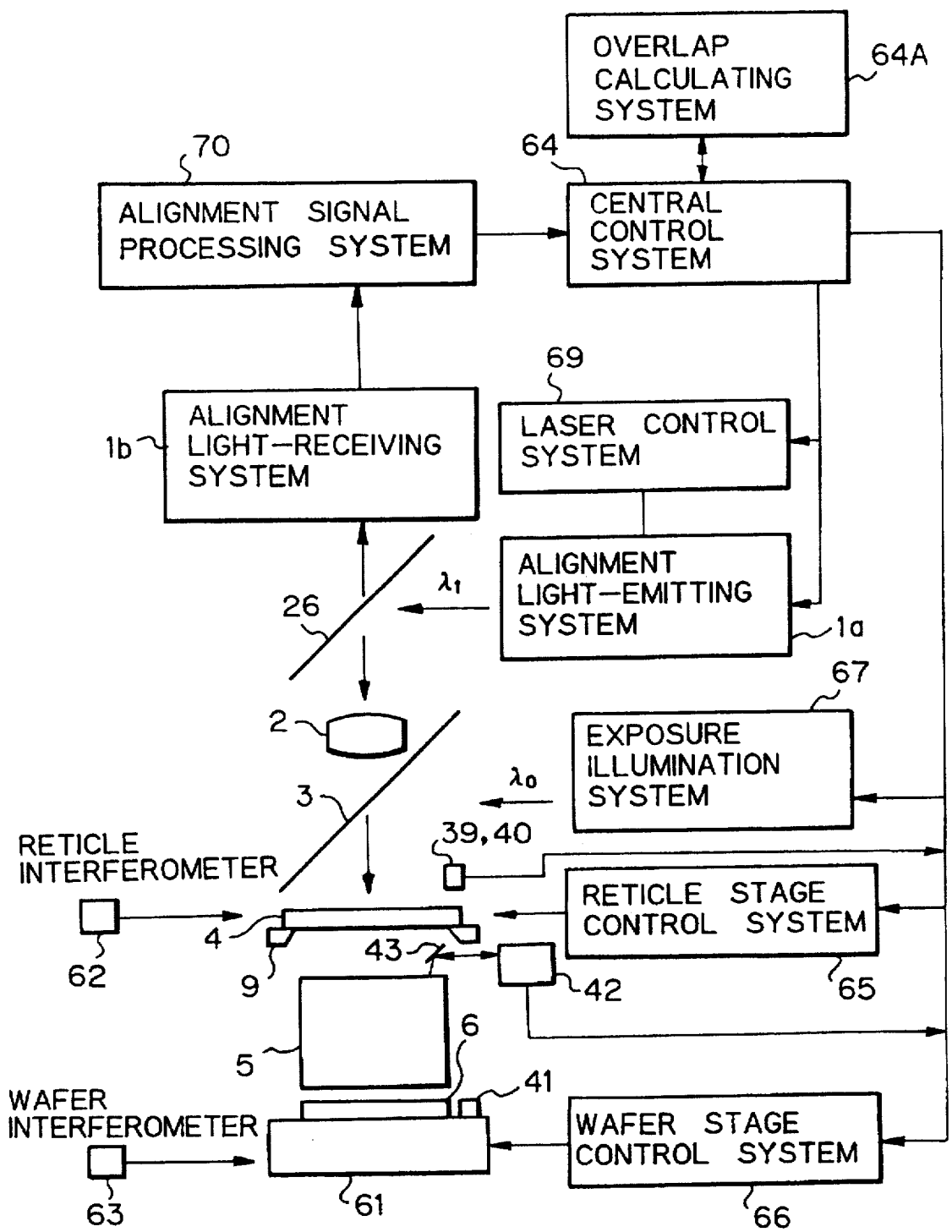
FIG. 2 is a block diagram schematically showing the entire arrangement of a projection exposure apparatus used in the embodiment of the present invention.

FIG. 2 schematically shows the entire arrangement of the projection exposure apparatus used in this embodiment. In the arrangement shown in FIG. 2, a reticle 4 is held on a reticle stage 9. A wafer 6 is held on a wafer stage 61. During exposure, the reticle 4 is irradiated with illuminating light having wavelength $\lambda_0$ for exposure from an exposure illumination system 67 via a dichroic mirror 3. Under the illuminating light, a pattern image of the reticle 4 is projected onto each shot region or area on the wafer 6, which has been coated with a photoresist, through a projection optical system 5, thereby exposing the shot area to light according to the pattern image. The reticle stage 9 and the wafer stage 61 effect positioning of the reticle 4 and the wafer 6 on respective planes which are perpendicular to the optical axis of the projection optical system 5. Two-dimensional coordinates of the reticle stage 9 and the wafer stage 61 are detected by a reticle-side interferometer 62 and a wafer-side interferometer 63, respectively. The results of the detection are supplied to a central control system 64. The central control system 64 controls the operations of the reticle and wafer stages 9 and 61 through a reticle stage control system 65 and a wafer stage control system 66, respectively.

Next, an arrangement for pre-alignment will be explained. A TTL (Through-The-Lens) pre-alignment sensor 42 is disposed in the vicinity of a side of the projection optical system 5. The pre-alignment sensor 42 irradiates a laser beam via a mirror 43, which is disposed between the reticle 4 and the projection optical system 5, and through the projection optical system 5 so that the laser beam is converged in a slit-like shape in the vicinity of a wafer mark on the wafer 6. Under these conditions, the wafer stage 61 is driven to scan the wafer 6 in the measuring direction. When the wafer mark comes to the laser beam, diffracted light is produced in a predetermined direction, and the diffracted light enters a light-receiving part of the pre-alignment sensor 42 through the projection optical system 5 and via the mirror 43. The incident diffracted light is photoelectrically converted in the light-receiving part of the pre-alignment sensor 42, and the resulting electrical signal is supplied to the central control system 64 from the pre-alignment sensor 42. The central control system 64 obtains two-dimensional coordinates of the wafer mark from values measured by the wafer-side interferometer 63 when the level of the photoelectrically converted signal reaches a maximum, and executes pre-alignment of the relevant shot region on the wafer 6 on the basis of the result of the detection. Although the pre-alignment sensor 42 in this embodiment is an LSA (Laser Step Alignment) type, an image pick-up type sensor may also be used, as a matter of course.

A reference mark member 41 which has reference marks formed thereon is fixed on the wafer stage 61. When reticle alignment is to be carried out, the reference mark member 41 is moved into the exposure field of the projection optical system 5, and the reference marks are illuminated with illuminating light having the same wavelength $\lambda_0$ as that of the illuminating light for exposure from the bottom side. Illuminating light passed through the reference mark then passes through the projection optical system 5 and forms a reference mark image on an alignment mark on the lower surface of the reticle 4. The alignment and reference mark images are taken by reticle alignment microscopes 39 and 40 which are disposed above the reticle 4. Imaging signals from the reticle alignment microscopes 39 and 40 are supplied to the central control system 64. The central control system 64 processes the supplied imaging signals to obtain an amount of displacement of the alignment mark relative to the reference mark.

Further, an alignment system of TTR and heterodyne interferometry type is provided to carry out final alignment. The alignment system includes a laser control system 69, an alignment light-emitting system 1a, a beam splitter 26, an objective lens 2, an alignment light-receiving system 1b, and an alignment signal processing system 70. When alignment is to be carried out, the central control system 64 instructs the alignment light-emitting system 1a through the laser control system 69 so that a laser light source in the alignment light-emitting system 1a emits a laser beam. The laser beam emitted from the laser light source in the alignment light-emitting system 1a is subjected to predetermined frequency modulation and then directed to the beam splitter 26 as alignment light. The laser beam is reflected by the beam splitter 26. The reflected laser beam passes through the objective lens 2 and the dichroic mirror 3 to irradiate the reticle 4. The laser beam that passes through the reticle 4 is irradiated to the reference mark member 41 (or wafer mark).

A heterodyne beam that is produced by diffraction at the reference mark member 41 (or wafer mark) and a heterodyne beam that is produced by diffraction at the reticle mark pass through the dichroic mirror 3, the objective lens 2 and the beam splitter 26 to enter the alignment light-receiving system 1b, in which two beat signals are generated. These beat signals are supplied to the alignment signal processing system 70, in which a phase difference between the two beat signals is detected, and the detected phase difference is supplied to the central control system 64. On the basis of the detected phase difference, the central control system 64 obtains a target phase difference for alignment, or carries out final alignment. It should be noted that, of the two beat signals, particularly the wafer-side beat signal (wafer beat signal) may become extremely weak in intensity according to the condition of the shot area on the wafer 6. For this reason, the intensity (amplitude) of the wafer beat signal is adjusted by an electrical variable amplifier (described later).

In this embodiment, during the pre-alignment an overlapping condition of the wafer mark and the irradiation region of the heterodyne beams is quantitatively calculated by an overlap calculating system 64A before the wafer 6 is positioned to a predetermined target position on the basis of the result of detection by the pre-alignment sensor 42, and the result of the calculation is supplied to the central control system 64. The central control system 64 instructs the variable amplifier to initiate adjustment of the intensity of the wafer beat signal when the overlapping condition falls within a predetermined range.

Next, the reticle alignment microscopes 39 and 40 and the alignment system of heterodyne interferometry type will be explained more specifically.

FIGS. 3(a) and 3(b) show the stage and alignment optical systems of the projection exposure apparatus in this embodiment. In these figures, a Z-axis is taken in parallel to the optical axis AX of the projection optical system 5, and X- and Y-axes are defined by an orthogonal coordinate system which is set on a plane perpendicular to the Z-axis. FIG. 3(a) is a front view of the projection exposure apparatus as viewed in the direction Y. FIG. 3(b) is a side view of the arrangement shown in FIG. 3(a). An alignment optical system 1 corresponds to the combination of the alignment light-emitting system 1a, the beam splitter 26 and the alignment light-receiving system 1b, which are shown in FIG. 2. A combination of X- and Y-stages 8X and 8Y for positioning the wafer 6 in the directions X and Y corresponds to the wafer stage 61 shown in FIG. 2. In the arrangement shown in FIGS. 3(a) and 3(b), a wafer holder 7 for holding the wafer 6 is provided between the wafer stage and the wafer 6. In actual practice, a Z-stage for positioning the wafer 6 in the direction Z is mounted on the X-stage 8X, and the reference mark member 41 is provided on the Z-stage.

The alignment optical system 1 emits reticle alignment illuminating lights $RB_1$ and $RB_2$ and wafer alignment illuminating lights $WB_1$ and $WB_2$, which have an average wavelength $\lambda_1$ different from the wavelength $\lambda_0$ of exposure light and a frequency difference $\Delta f$ (50 kHz in this embodiment).

As shown in FIG. 3(a), the reticle alignment illuminating lights $RB_1$ and $RB_2$ are converged on the reticle 4 by the objective lens 2 and irradiated to a diffraction grating-shaped reticle mark 35A on the lower side of the reticle 4 at respective incidence angles $-\theta_{R1}$ and $+\theta_{R1}$.

Figure 4:
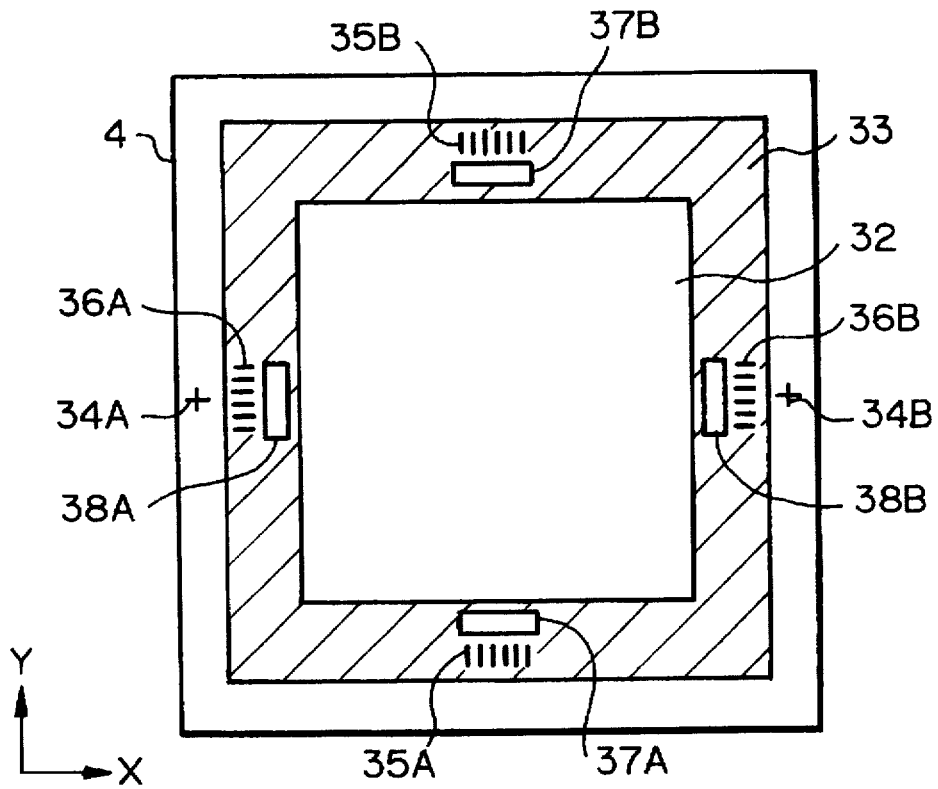
FIG. 4 is a plan view showing a pattern layout on a reticle in the arrangement shown in FIGS. 3(a) and 3(b).

FIG. 4 shows a pattern arrangement of the reticle 4 in this embodiment. Referring to FIG. 4, the reticle 4 has a pattern region or area 32 in the center thereof. A light-blocking or shading zone 33 is formed around the pattern region 32. Reticle marks or reference marks, 36A and 36B for the Y-axis are respectively formed on two sides of the light-blocking zone 33 which extend in the direction Y. Each of the reticle marks 36A and 36B comprises a plurality of diffraction gratings which are spaced at a pitch $P_R$ in the direction Y. Reticle marks or reference marks, 35A and 35B for the X-axis are respectively formed on two sides of the light-blocking zone 33 which extend in the direction X. Each of the reticle marks 35A and 35B comprises a plurality of diffraction gratings which are spaced at pitch $P_R$ in the direction X. Transmissive windows (hereinafter referred to as "reticle windows") 37A and 37B for passing alignment light directed toward the wafer are formed at respective positions which are inside the reticle marks 35A and 35B (i.e. at the sides thereof which are closer to the pattern region 32). Reticle windows 38A and 38B for passing alignment light directed toward the wafer are formed at respective positions which are inside the reticle marks 36A and 36B (i.e. at the sides thereof which are closer to the pattern region 32). Further, the reticle 4 has cross-shaped alignment marks 34A and 34B which are formed at respective positions which are outside the light-blocking zone 33, and which are adjacent to the reticle marks 36A and 36B.

Figure 10:
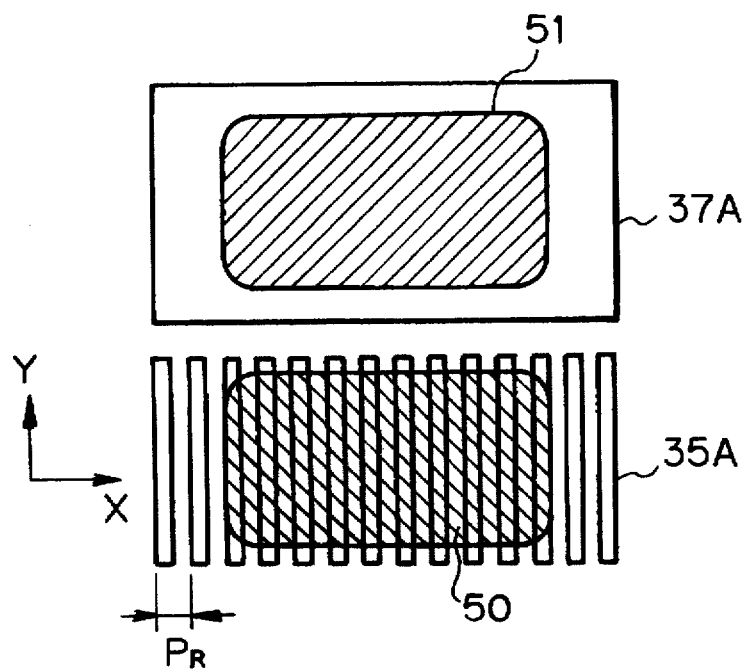
FIG. 10 is an enlarged plan view showing a reticle mark and a reticle window.

FIG. 10 is an enlarged view of the reticle mark 35A and the reticle window 37A, which are shown in FIG. 4. A light beam 50 which is composed of the illuminating lights $RB_1$ and $RB_2$ is irradiated to the reticle mark 35A, and a light beam 51 which is composed of the illuminating lights $WB_1$ and $WB_2$ passes through the reticle window 37A.

Referring back to FIGS. 3(a) and 3(b), the incidence angles $-\theta_{R1}$ and $+\theta_1$ and the grating pitch $P_R$ of the reticle mark 35A are related to each other as follows:

$$\sin(\theta_{R1}) = \lambda_1/P_R \quad (1)$$

Positive (+) first-order diffracted light $RB_1^{+1}$ derived from the illuminating light $RB_1$ and negative (−) first-order diffracted light $RB_2^{-1}$ derived from the illuminating light beam $RB_2$ emanate from the reticle mark 35A at right angles to the plane thereof and return to the alignment optical system 1 through the objective lens 2 as alignment detection light (heterodyne beams).

On the other hand, the wafer alignment illuminating lights $WB_1$ and $WB_2$ pass through the reticle window 37A of the reticle 4 and reach a chromatic aberration control plate 10 in the projection optical system 5. Portions of the chromatic aberration control plate 10 through which the wafer alignment illuminating lights $WB_1$ and $WB_2$ pass are formed with diffraction grating-shaped axial chromatic aberration control elements $G1_A$ and $G1_B$ (see FIG. 9), respectively, so that the wafer alignment illuminating light beams $WB_1$ and $WB_2$ are bent at respective angles $-\theta_{G1}$ and $+\theta_{G1}$ and irradiated to a diffraction grating-shaped wafer mark 48A at respective incidence angles $-\theta_{w1}$ and $+\theta_{w1}$.

Figure 5:
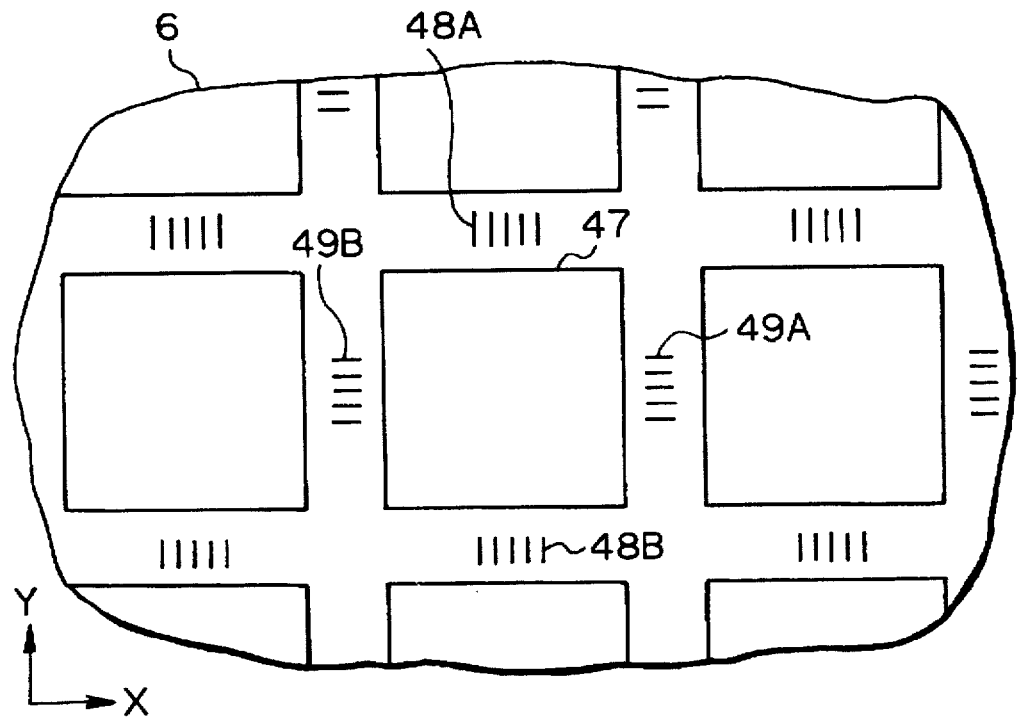
FIG. 5 is an enlarged plan view showing shot areas and wafer marks on a wafer in the arrangement shown in FIGS. 3(a) and 3(b).

FIG. 5 shows a part of the shot area layout on the wafer 6. Referring to FIG. 5, wafer marks or substrate marks, 49A and 49B for the Y-axis are formed so as to sandwich a shot region 47 as an object of exposure as viewed in the direction X. Each of the wafer marks 49A and 49B comprises a plurality of diffraction gratings spaced at a pitch $P_W$ in the direction Y. Wafer marks or substrate marks, 48A and 48B for the X-axis are formed so as to sandwich the shot region 47 as viewed in the direction Y. Each of the wafer marks 48A and 48B comprises a plurality of diffraction gratings spaced at a pitch $P_W$ in the direction X. The other shot regions are also provided with wafer marks similar to those described above.

Figure 11:
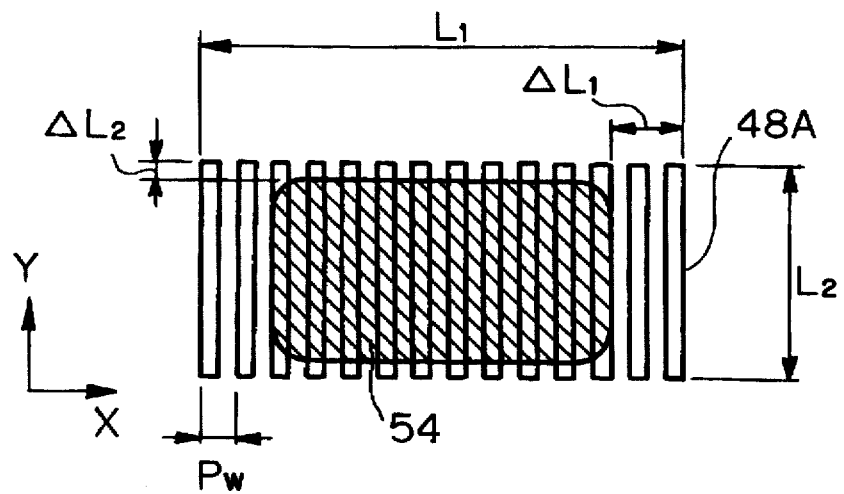
FIG. 11 is an enlarged plan view showing a wafer mark.

FIG. 11 is an enlarged view of the wafer mark 48A shown in FIG. 5. Referring to FIG. 11, the wafer mark 48A is irradiated with the light beam 51, which is composed of the illuminating lights $WB_1$ and $WB_2$. The wafer mark 48A has a rectangular region as a whole, which has a length $L_1$ in the direction X and a length $L_2$ in the direction Y. That is, the wafer mark 48A is longer than the irradiation region 54 of the light beam 51 by $2\Delta L_1$ in the direction X and by $2\Delta L_2$ in the direction Y. Although there is no particular restriction on the size of $\Delta L_1$ and $\Delta L_2$, it is preferable for $\Delta L_1$ and $\Delta L_2$ to be more than about 20% of the lengths $L_1$ and $L_2$ in the directions X and Y of the irradiation region 54.

Referring back to FIG. 3(a), the incidence angles $-\theta_{w1}$ and $+\theta_{w1}$ and the grating pitch $P_W$ of the wafer mark 48A are related to each other as follows:

$$\sin(\theta_{w1}) = \lambda_1/P_W \quad (2)$$

+ First-order diffracted light $WB_1^{+1}$ derived from the illuminating light $WB_1$ and − first-order diffracted light $WB_2^{-1}$ derived from the illuminating light $WB_2$ emanate from the wafer mark 48A at right angles to the plane thereof. These two diffracted light beams serve as alignment detection light (heterodyne beams).

In this case, as shown in FIG. 3(b), the wafer alignment illuminating light is deflected by the action of the chromatic aberration control plate 10 so as to be incident on the wafer 6 at a tilt of $\theta_m$ in the non-measuring direction (direction Y). Therefore, the position on the chromatic aberration control plate 10 at which each alignment detection light passes through it differs from the position at which the light passes through the chromatic aberration control plate 10 when incident thereon. The alignment detection light from the wafer mark 48A passes through an axial chromatic aberration control element $G1_c$ on the chromatic aberration control plate 10 (see FIG. 9), thereby being corrected for lateral chromatic aberration. Thereafter, the alignment detection light returns to the alignment optical system 1 through the reticle window 37A and the objective lens 2. The wafer alignment illuminating light illuminates a position on the surface of the wafer 6 which is shifted by $\Delta\beta$ in the direction Y from a position which would otherwise be illuminated when no chromatic aberration control plate 10 is disposed.

Figure 9:
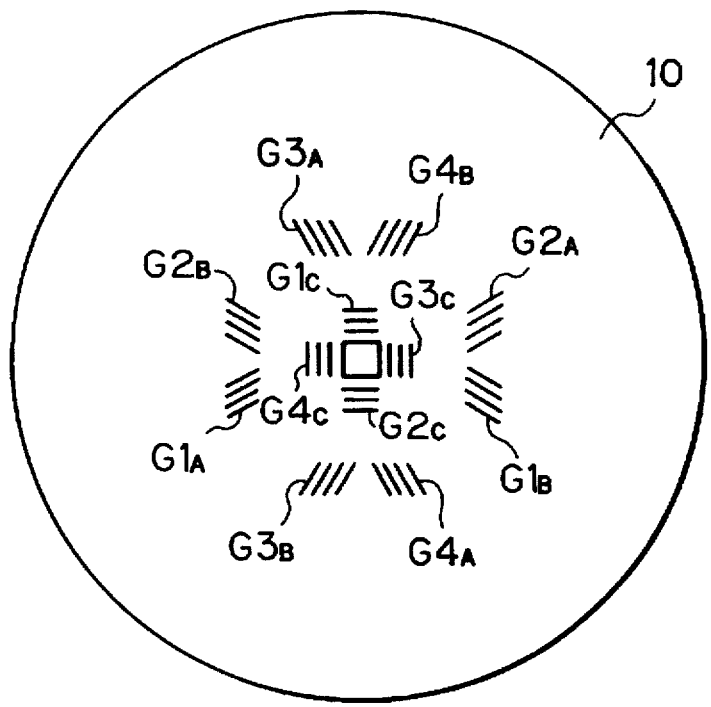
FIG. 9 is a plan view of the arrangement of axial chromatic aberration control elements on a chromatic aberration control plate in the arrangement shown in FIGS. 3(a) and 3(b).

FIG. 9 shows the chromatic aberration control plate 10. Referring to FIG. 9, the chromatic aberration control plate 10 is a transmissive glass substrate which has 12 axial chromatic aberration control elements arranged thereon. Among them, three axial chromatic aberration control elements $G1_A$, $G1_B$ and $G1_C$ are used to deflect the wafer alignment illuminating light and alignment detection light in the alignment optical system 1 as shown in FIGS. 3(a) and 3(b). In actual practice, there are three other alignment optical systems for three axes. Therefore, the chromatic aberration control plate 10 is provided with a total of 12 (=3×4) axial chromatic aberration control elements $G1_A$, $G1_B$, $G1_C$ ... $G4_A$, $G4_B$ and $G4_C$.

Figure 8A:
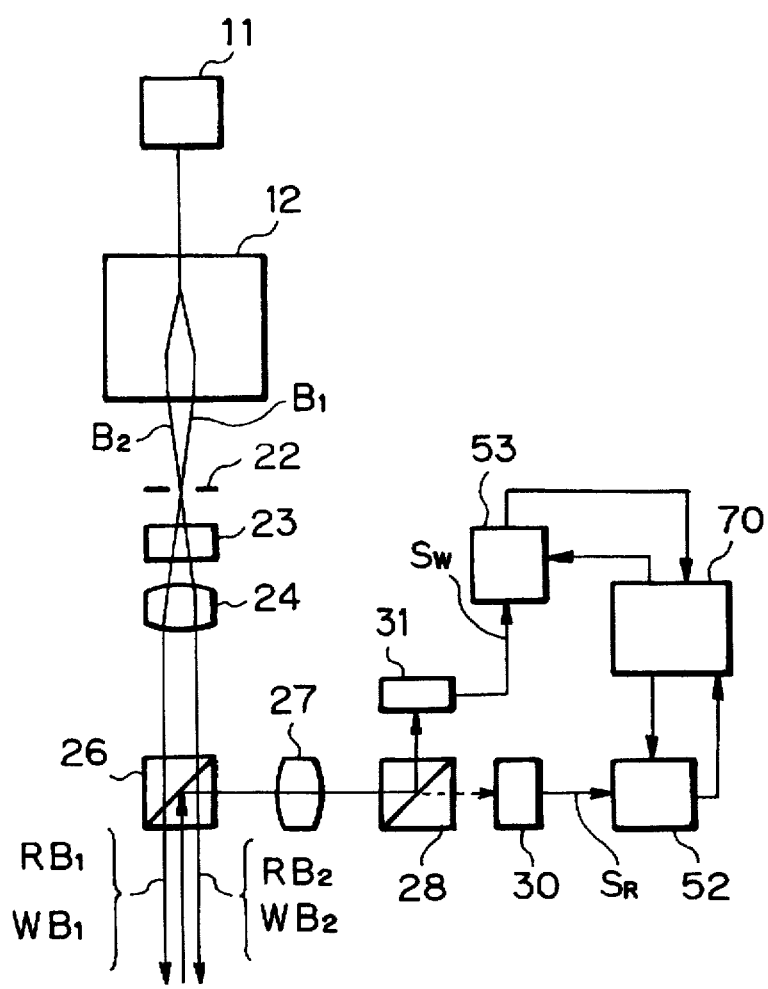
FIG. 8(a) is a front view showing the arrangement of the alignment optical system shown in FIGS. 3(a) and 3(b)
Figure 8B:
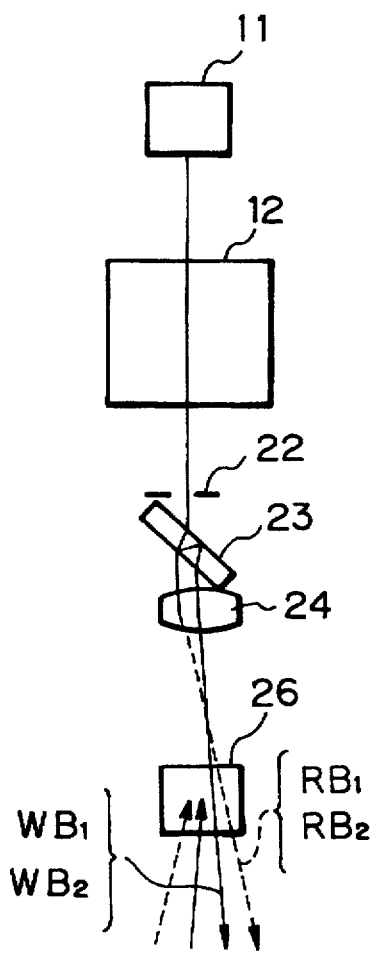
FIG. 8(b) is a side view of the alignment optical system shown in FIG. 8(a)
Figure 8C:
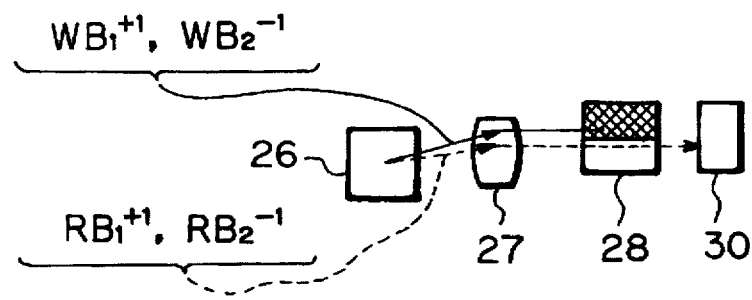
FIG. 8(c) is a bottom view of the alignment optical system shown in FIG. 8(a).

The alignment optical system 1 will be explained below in detail with reference to FIGS. 8(a), 8(b) and 8(c). FIG. 8(a) shows the alignment optical system 1 as seen in the same direction as in the case of FIG. 3(a). FIG. 8(b) shows the alignment optical system 1 as seen in the direction as in the case of FIG. 3(b). FIG. 8(c) is a bottom view of the arrangement shown in FIG. 8(a).

Referring to FIGS. 8(a), 8(b) and 8(c), a laser beam having wavelength $\lambda_1$ is emitted from a laser light source 11, which is, for example, a laser diode. The laser beam enters a modulation optical system 12 in which it is subjected to frequency modulation of $+(F_1-F_2)$ and $-(F_1-F_2)$ with respect to the original laser beam emitted from the laser light source 11 by means of a pair of acousto-optic modulator elements which are driven at respective frequencies $F_1$ and $F_2$, thereby producing frequency-modulated alignment beams $B_1$ and $B_2$. As a result, the frequency difference $\Delta f$ between the alignment beams $B_1$ and $B_2$ is expressed by $2(F_1-F_2)$. In this embodiment, $\Delta f$ is assumed to be set at 50 kHz.

The alignment beams $B_1$ and $B_2$ emitted from the modulation optical system 12 are converged on a field stop 22, which determines a beam configuration on the reticle or the wafer. Thereafter, the alignment beams $B_1$ and $B_2$ are divided by a reticle and wafer beam separating prism 23 into reticle alignment illuminating light $RB_1$ and $RB_2$ and wafer alignment illuminating light $WB_1$ and $WB_2$. Thereafter, the alignment illuminating lights pass through a lens 24 and a beam splitter 26 to illuminate the reticle 4 and the wafer 6.

On the other hand, the alignment detection light from the reticle mark or reference mark 35A and the wafer mark 48A, which are shown in FIGS. 3(a) and 3(b), returns to the alignment optical system 1, shown in FIG. 8(a) and 8(b), and is then reflected by the beam splitter 26. The reflected light passes through a lens 27 and then enters a detection light separating prism 28 which is disposed in conjugate relation to the reticle and the wafer. The detection light separating prism 28 separates the detection light into reticle detection light $RB_1^{+1}$ and $RB_2^{-1}$ and wafer detection light $WB_1^{+1}$ and $WB_2^{-1}$. The reticle detection light $RB_1^{+1}$ and $RB_2^{-1}$ pass through the detection light separating prism 28 and are received by a photoelectric detector 30. The wafer detection light $WB_1^{+1}$ and $WB_2^{-1}$ are reflected by the detection light separating prism 28 and received by a photoelectric detector 31. The photo-electric detector 30 outputs a reticle beat signal $S_R$ which corresponds to the position of the reticle mark. The photoelectric detector 31 outputs a wafer beat signal $S_W$ which corresponds to the position of the wafer mark.

The reticle beat signal $S_R$ and the wafer beat signal $S_W$ are supplied to variable amplifiers 52 and 53, respectively, where the output levels of the beat signals are adjusted. The beat signals $S_R$ and $S_W$ whose output levels have been adjusted are supplied to the alignment signal processing system 70. The alignment signal processing system 70 sets amplification factors for the variable amplifiers 52 and 53, makes a phase comparison between the two beat signals, and supplies the result of the comparison to the central control system 64.

The reticle beat signal $S_R$ is a sinusoidal beat signal having frequency $\Delta f$ formed from the detection light $RB_1^{+1}$ and $RB_2^{-1}$. The wafer beat signal $S_W$ is a sinusoidal beat signal having frequency $\Delta f$ formed from the detection light $WB_1^{+1}$ and $WB_2^{-1}$. The phase difference $\Delta\phi$ [rad] between the two beat signals changes with the relative movement of the reticle 4 and the wafer 6 in the direction X. The amount of relative movement $\Delta x$ is given by the following equations:

$$\Delta x(\text{on the reticle}) = P_R \cdot \Delta\phi/(4\pi) \quad (3)$$

$$\Delta x(\text{on the wafer}) = P_W \cdot \Delta\phi/(4\pi) \quad (4)$$

It should be noted that, by the alignment system for the direction Y, beat signals corresponding to a reticle mark and a wafer mark for the Y-axis are obtained, and a phase difference between the beat signals is determined.

It should be noted that, although in FIGS. 3(a) and 3(b) the wafer mark has been positioned under the projection optical system 5, when the alignment optical system 1 is to be adjusted (calibrated), the reference mark member 41 is moved to a position under the projection optical system 5, and a grating mark on the reference mark member 41 is illuminated with the wafer alignment illuminating light.

Figure 7:
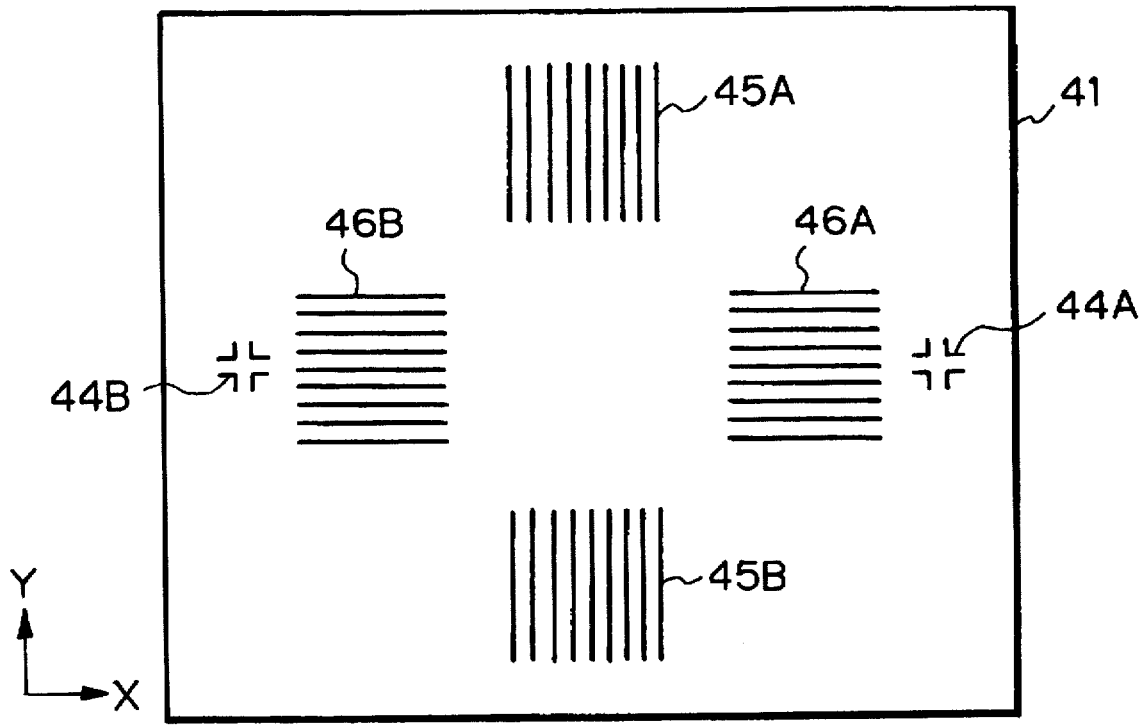
FIG. 7 is an enlarged plan view showing a mark layout on a reference mark member in the arrangement shown in FIGS. 3(a) and 3(b).

FIG. 7 is a plan view showing the arrangement on the reference mark member 41. In FIG. 7, the reference mark member 41 is formed from a transmissive glass substrate or the like. The upper surface of the reference mark member 41 is formed with frame-shaped reference marks 44A and 44B at a predetermined spacing in the direction X. In the space between the reference marks 44A and 44B, reference diffraction grating marks 45A, 45B, 46A and 46B are formed. Each of the reference diffraction grating marks 46A and 46B comprises a plurality of diffraction gratings which are spaced at a predetermined pitch in the direction Y. Each of the reference diffraction grating marks 45A and 45B comprises a plurality of diffraction gratings which are spaced at a predetermined pitch in the direction X. The pitch of the reference diffraction grating marks 45A to 46B is equal to the pitch of the wafer marks or substrate marks, 48A to 49B, which are shown in FIG. 4.

As has been described above, when reticle alignment is to be carried out, the reference mark member 41 is moved into the exposure field of the protection optical system 5, and the reference marks 44A and 44B are illuminated with illuminating light having the same wavelength $\lambda_0$ as that of the illuminating light for exposure from the bottom side. When the alignment optical system 1 is to be subjected to calibration also, the reference mark member 41 is moved into the exposure field of the projection optical system 5, and the grating mark 45A on the reference mark member 41 is illuminated with the wafer alignment illuminating light in the same way as the wafer mark.

Next, one example of an operation which is performed when reticle alignment is carried out by the method of this embodiment to transfer a reticle pattern onto a wafer will be explained with reference to the flowchart of FIG. 1. For the sake of simplicity, positioning in the direction X will mainly be explained below.

First, the wafer stage 8X, shown in FIGS. 3(a) and 3(b), is driven to set the reference mark member 41 in the exposure field of the projection optical system 5. Then, the reference marks 44A and 44B of the reference mark member 41, shown in FIG. 7, are irradiated with illuminating light having the same wavelength $\lambda_0$ as that of illuminating light for exposure from the bottom side thereof. The illuminating light that passes through the reference marks 44A and 44B passes through the projection optical system 5, shown in FIGS. 3(a) and 3(b), and forms images of the reticle-side alignment marks 34A and 34B and images of the reference marks 44A and 44B on CCD cameras in the reticle alignment microscopes 39 and 40.

Figure 6:
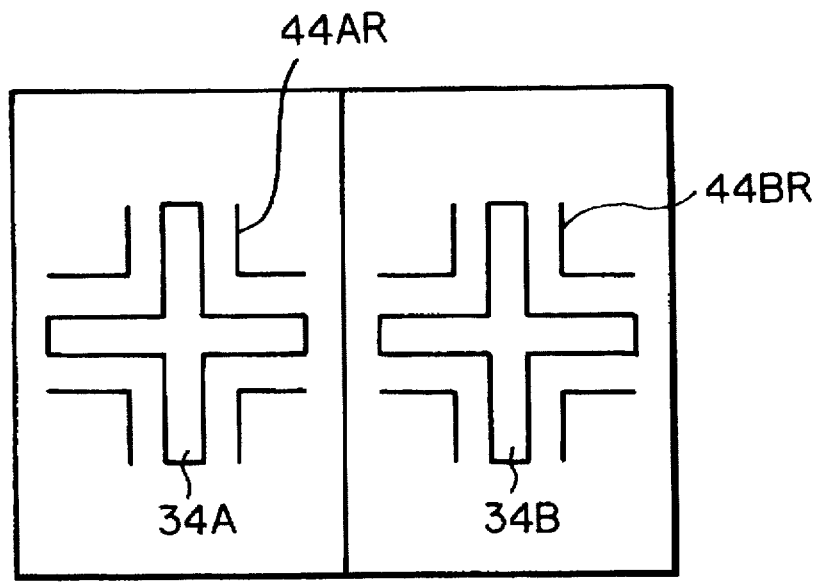
FIG. 6 shows images observed by means of reticle alignment microscopes in the arrangement shown in FIGS. 3(a) and 3(b).

FIG. 6 shows the images of the reference marks 44A and 44B and the images of the reticle-side alignment marks 34A and 34B, which are observed by means of the CCD cameras. In FIG. 6, the images are electrically synthesized into a single image frame. Amounts of displacement of the alignment marks 34A and 34B relative to the images of the reference mark images 44AR and 44BR are detected by image processing. The two reticle alignment microscopes 39 and 40 each measure one set of relative displacement quantities ($\Delta x_1$, $\Delta y_1$) and ($\Delta x_2$, $\Delta y_2$) in the directions X and Y. An average value of the displacement quantities $\Delta x_1$ and $\Delta x_2$ is assumed to be $\Delta x$.

Meanwhile, the alignment system of heterodyne interferometry type measures a phase difference (initial phase difference) $\Delta \phi_0$ between the reticle beat signal $S_R$ corresponding to the reticle mark 35A and the wafer beat signal $S_W$ corresponding to the reference diffraction grating mark 45A. Although there are two alignment systems of heterodyne interferometry type for each of the two directions X and Y, as has already been described, explanation will be made herein with respect to only one axis in the direction X for the sake of simplicity.

On the basis of a total of four displacement quantities ($\Delta x_1$, $\Delta y_1$) and ($\Delta x_2$, $\Delta y_2$) detected by the reticle alignment microscopes 39 and 40, it is possible to determine how the reticle 4 is displaced relative to the reference marks 44A and 44B at the position of the reticle alignment microscopes 39 and 40. For example, an amount of rotation can be detected from the difference between $\Delta y_1$ and $\Delta y_2$, and an amount of parallel displacement in the direction Y can be detected from an average value of $\Delta y_1$ and $\Delta y_2$. Similarly, magnification displacement can be detected from the difference between $\Delta x_1$ and $\Delta x_2$, and an amount of parallel displacement in the direction X can be detected from an average value of $\Delta x_1$ and $\Delta x_2$. Among these displacement components, the magnification component is assumed to be corrected by an imaging characteristic control device (not shown) provided in the projection optical system 5, and by using the remaining X-axis parallel component, Y-axis parallel component and rotational component, a relative displacement between the reticle 4 and the reference marks 44A and 44B is obtained. An amount of relative displacement in the direction X between the reticle 4 and the reference marks 44A and 44B on the reticle 4, which is obtained as described above, is $\Delta x$.

Next, the displacement quantity $\Delta x$ is converted into a phase difference $\Delta \phi$ according to Eq. (3). The phase difference $\Delta \phi$ thus obtained is subtracted from the initial phase difference $\Delta \phi_0$, thereby determining a target phase difference $\Delta \phi_T$. This means that the phase difference between the two beat signals $S_R$ and $S_W$ when the reticle 4 (more precisely, the alignment marks 34A and 34B) is coincident with the reference marks 44A and 44B in the direction X is defined as the target phase difference $\Delta \phi_T$. However, displacement may occur when the reference marks 44A and 44B are formed, and the wafer marks on the wafer 6 may be displaced from the design positions during various kinds of process, causing an offset to be superimposed on the displacement. Therefore, the target phase difference $\theta_T$ is corrected in accordance with such displacement or offset. Further, the positional relationship of the wafer marks provided for each shot area on the wafer 6 with the reference marks 44A and 44B has been measured in advance. Thereafter, pre-alignment is carried out.

Figure 1A:
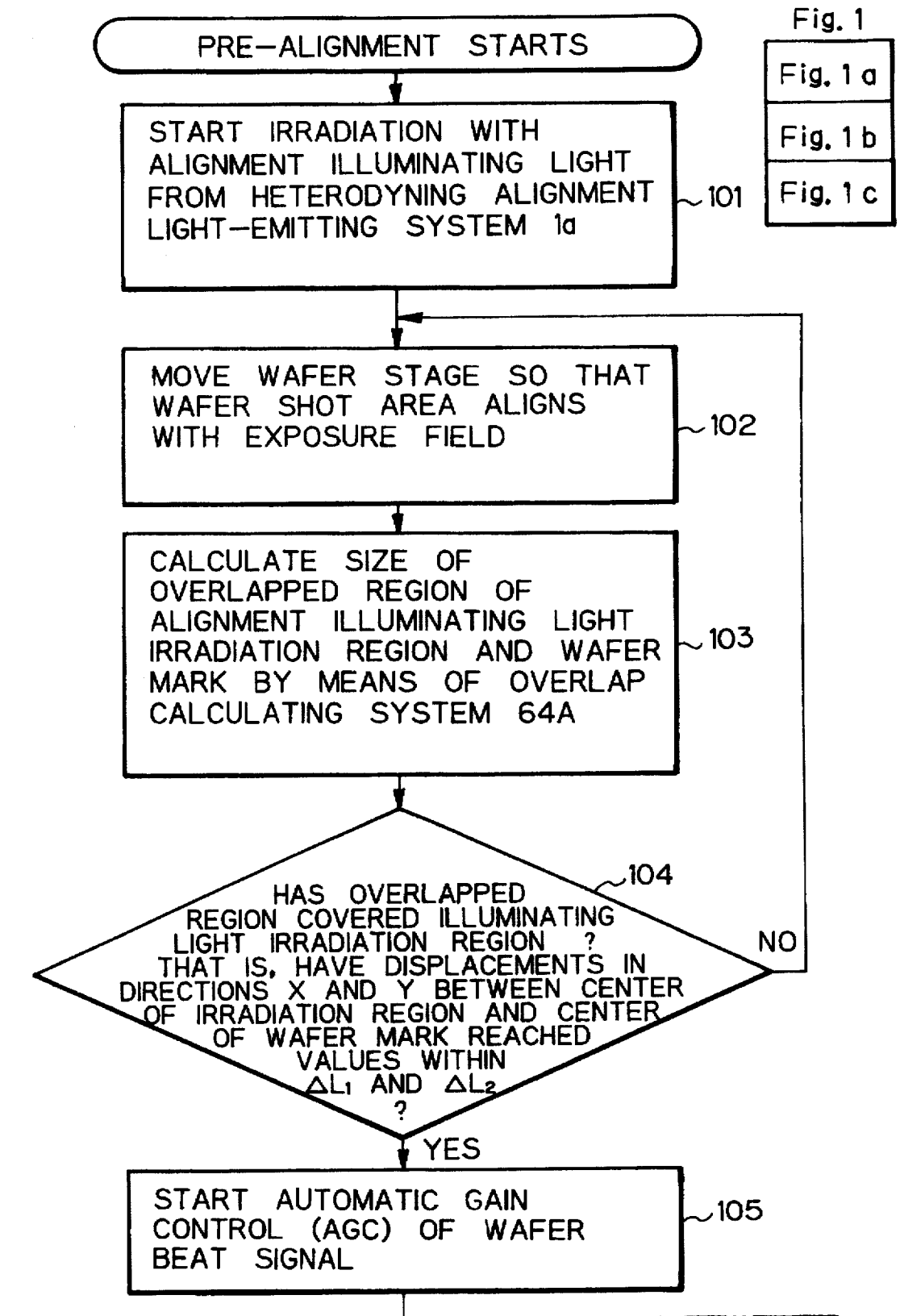
FIG. 1(a) to FIG. 1(c), and FIG. 1(a) to FIG. 1(c) are a flowchart showing one embodiment of the alignment method according to the present invention.
Figure 1B:
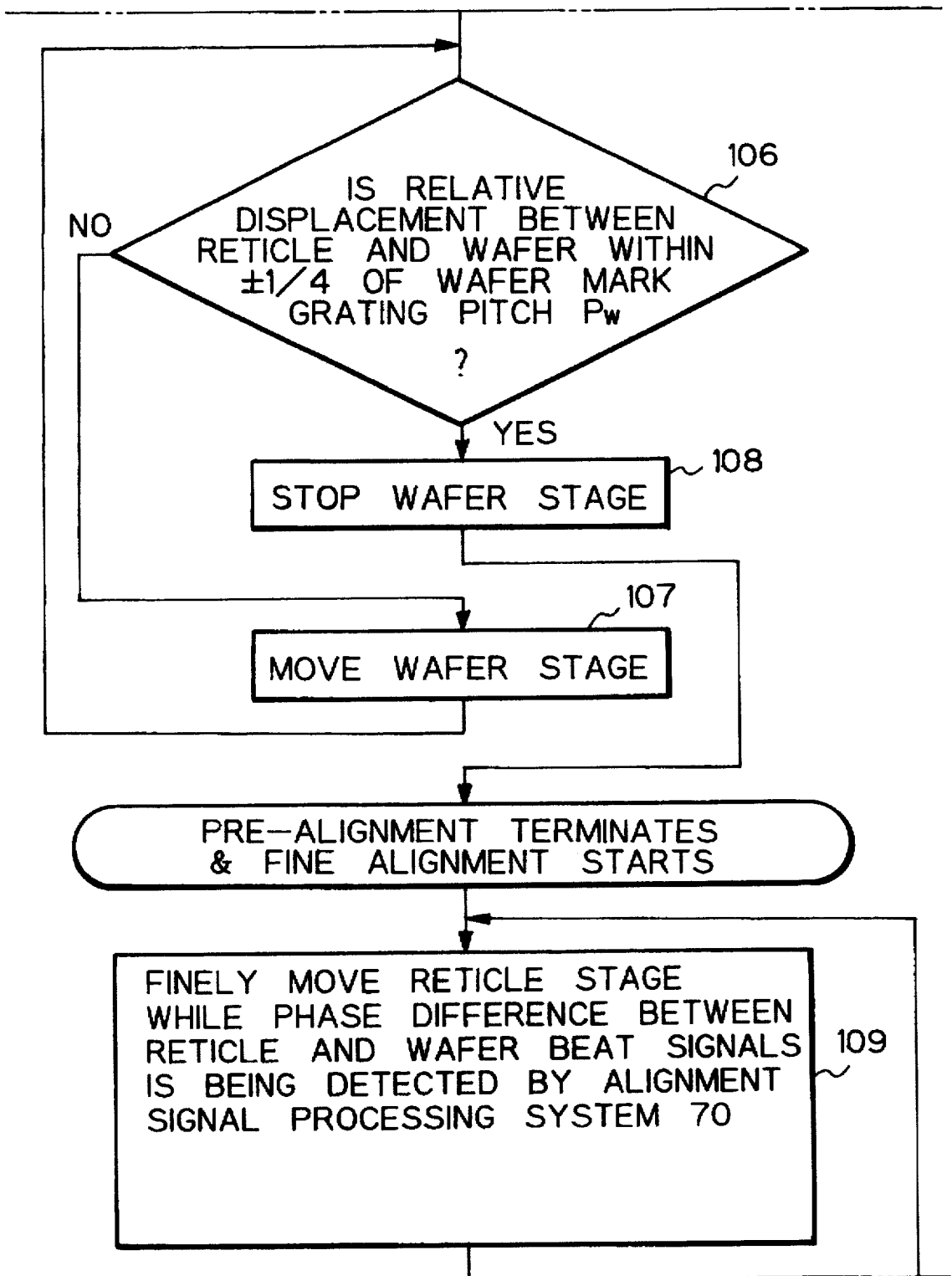
Figure 1C:
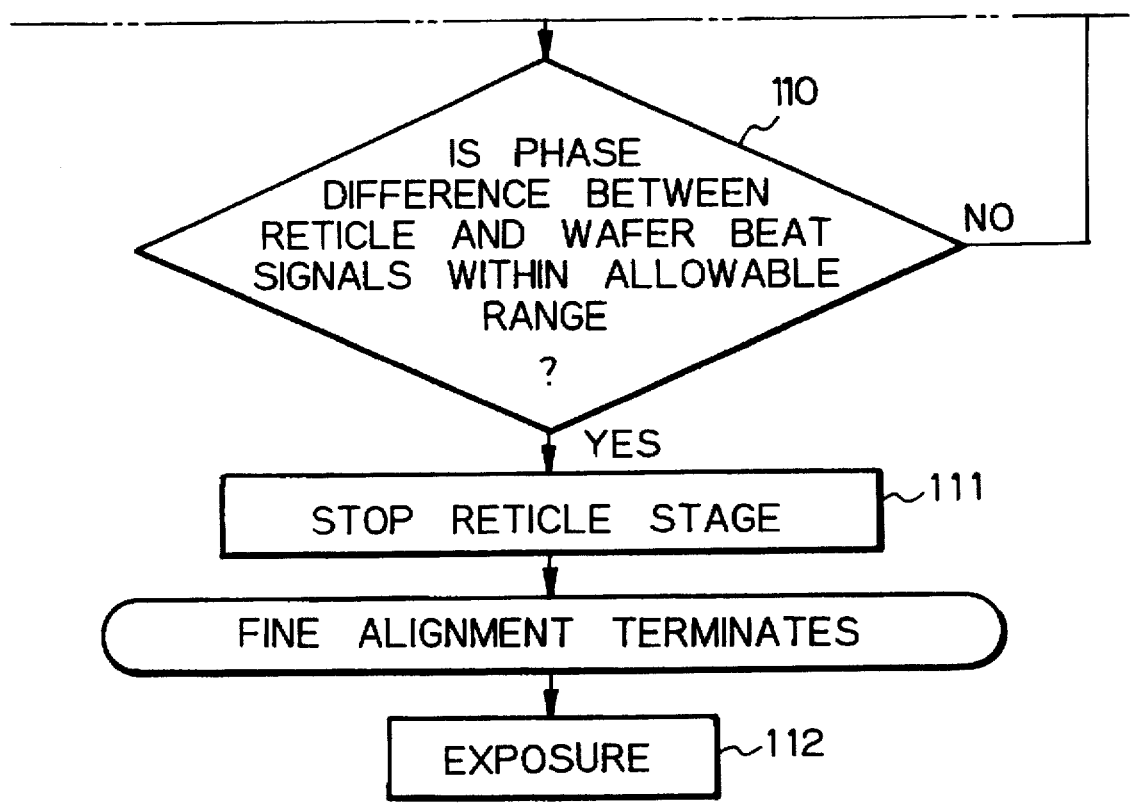

FIG. 1 is a flowchart showing process steps carried out from pre-alignment to exposure. At Step 101, irradiation with alignment illuminating light from the alignment light-emitting system 1a of heterodyne interferometry type is initiated. Thereafter, at Step 102, a shot region or area 47 defined as an object of exposure on the wafer 6, shown in FIG. 5, is set in the exposure field by pre-alignment. The pre-alignment sensor 42, shown in FIG. 3(b), is used for the pre-alignment. First, the wafer position is approximately measured by the pre-alignment sensor 42. Next, the wafer stage 61 (including the X-stage 8X and the Y-stage 8Y) is moved so that the shot region 47 comes into the exposure field.

The wafer mark or substrate mark 48A is larger in size than the irradiation region 54 of the light beam 51 by $2\Delta L_1$ in the measuring direction (direction X) and by $2\Delta L_2$ in the non-measuring direction (direction Y), as shown in FIG. 11 (described above). An approximate positional relationship between the wafer mark 48A and the irradiation region 54 of the light beam 51 is measured by the pre-alignment sensor 42 and the wafer-side interferometer 63, and the result of the measurement is supplied to the overlap calculating system 64A. At Step 103, the overlap calculating system 64A calculates a size of the overlap region of the irradiation region 54 and the wafer mark 48A.

At the subsequent Step 104, the central control system 64 judges whether or not the calculated overlap region has covered the irradiation region 54, that is, whether or not the displacement between the center of the wafer mark 48A and the center of the irradiation region 54 of the light beam 51 has reached a value within $\pm \Delta L_1$ in the measuring direction (direction X) and a value within $\pm \Delta L_2$ in the non-measuring direction (direction Y) before the wafer stage 61 reaches a target position, that is, before the amount of displacement between the reticle mark or reference mark 35A and the wafer mark 48A reaches a value within the range of $\pm \frac{1}{4}$ of the grating pitch $P_W$ and hence a phase comparison between the reticle beat signal $S_R$ and the wafer beat signal $S_W$ can be made. If the amount of displacement between the centers of the wafer mark 48A and the irradiation region 54 exceeds $\pm \Delta L_1$ and $\pm \Delta L_2$, the process returns to Step 102.

If it is confirmed by the central control system 64 on the basis of the result of calculation made by the overlap calculating system 64A that the displacement between the center of the wafer mark 48A and the center of the irradiation region 54 of the light beam 51 has reached a value within $\pm \Delta L_1$ in the measuring direction (direction X) and a value within $\pm \Delta L_2$ in the non-measuring direction (direction Y), the process proceeds to Step 105 where automatic gain control (AGC) of the wafer beat signal $S_W$ is initiated in response to a command from the central control system 64. That is, the amplification factor in the variable amplifier 53, shown in FIG. 8(a), is adjusted so that the amplitude of the output signal from the variable amplifier 53 becomes a predetermined value.

Although in this embodiment AGC of the wafer beat signal $S_W$ is initiated when the displacement between the center of the wafer mark 48A and the center of the irradiation region 54 of the light beam 51 has reached a value within $\pm \Delta L_1$ in the measuring direction (direction X) and a value within $\pm \Delta L_2$ in the non-measuring direction (direction Y), it should be noted that AGC may be initiated at any time that the amplitude of the wafer beat signal $S_W$ has approximately reached a maximum.

Figure 13:
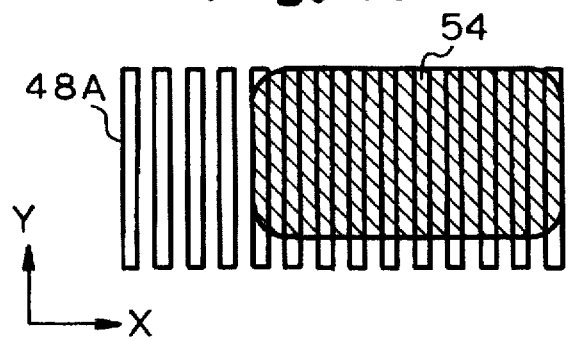
FIG. 13 is an enlarged plan view showing the positional relationship between a wafer mark and an irradiation region when an amplification factor adjusting operation is initiated.
Figure 14:
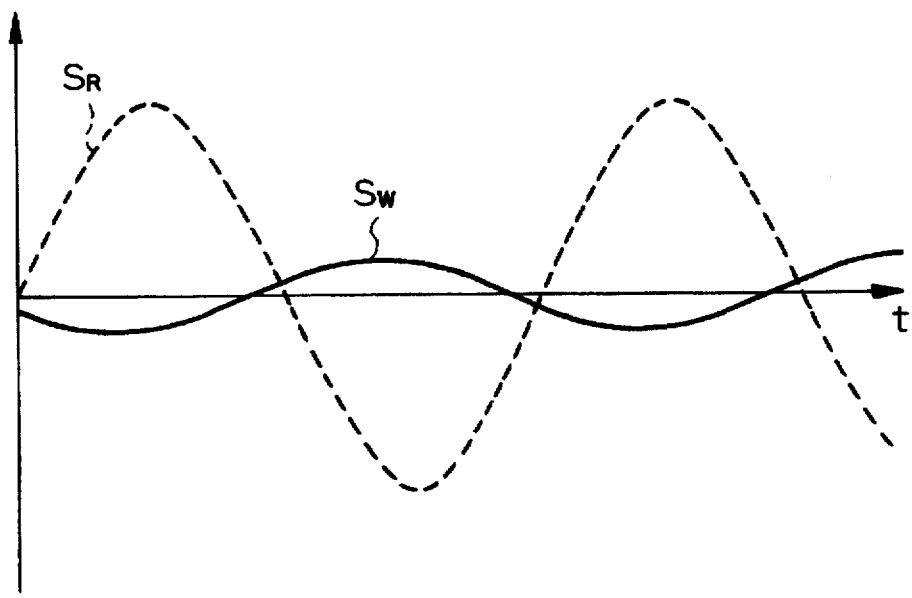
FIG. 14 is a waveform chart showing the phase relationship between two beat signals obtained by the alignment system of heterodyne interferometry type when the amplification factor adjusting operation is initiated.

FIG. 13 shows one example of the relative positional relationship between the wafer mark 48A and the irradiation region 54 of the light beam 51 for alignment at the time when AGC is initiated. FIG. 14 shows one example of the wafer beat signal $S_W$ at the time when AGC is initiated. As shown in FIG. 13, the wafer mark 48A is approaching a position where it is displaced relative to the irradiation region 54 by $\Delta L_1$ and $\Delta L_2$ in the directions X and Y. In FIG. 14, the amplitude of the wafer beat signal $S_W$ is extremely smaller than the amplitude of the reticle beat signal $S_R$; this indicates that the output of the wafer beat signal $S_W$ is weak.

Accordingly, the amplification factor in the variable amplifier 53 is set at a large value.

Thereafter, the central control system 64 judges at Step 106 whether or not the relative displacement between the reticle 4 and the wafer mark 48A is within ±¼ of the grating pitch $P_W$ on the basis of the measured positions of the reticle 4 and the wafer mark 48A. If the amount of displacement is outside the range of $\pm P_W/4$, the wafer stage 61 is moved at Step 107.

During the AGC operation also, the operation of moving and positioning the wafer stage 61 with respect to the target position is continued, and when it is judged at Step 106 that the positional displacement between the reticle mark 35A and the wafer mark 48A has reached a value in the range of ±¼ pitch $P_W$, the drive of the wafer stage 61 is stopped at Step 108. Upon completion of Step 108, the pre-alignment terminates.

Subsequently, fine alignment (final alignment) is carried out by the alignment system of heterodyne interferometry type. At Step 109, the reticle stage 9 is moved while a phase difference between the reticle beat signal $S_R$ and the wafer beat signal $S_W$, which are generated by irradiation with alignment illuminating light, is being detected by the alignment signal processing system 70. At Step 110, a difference between the phase difference $\Delta\phi_1$ between the two beat signals $S_R$ and $S_W$ and the target phase difference $\Delta\phi_T$ is calculated, and the reticle stage 9 is moved so that the calculated difference falls within an allowable range. When the difference falls within the allowable range, the drive of the reticle stage 9 is stopped at Step 111. Thus, the fine alignment terminates.

Figure 12:
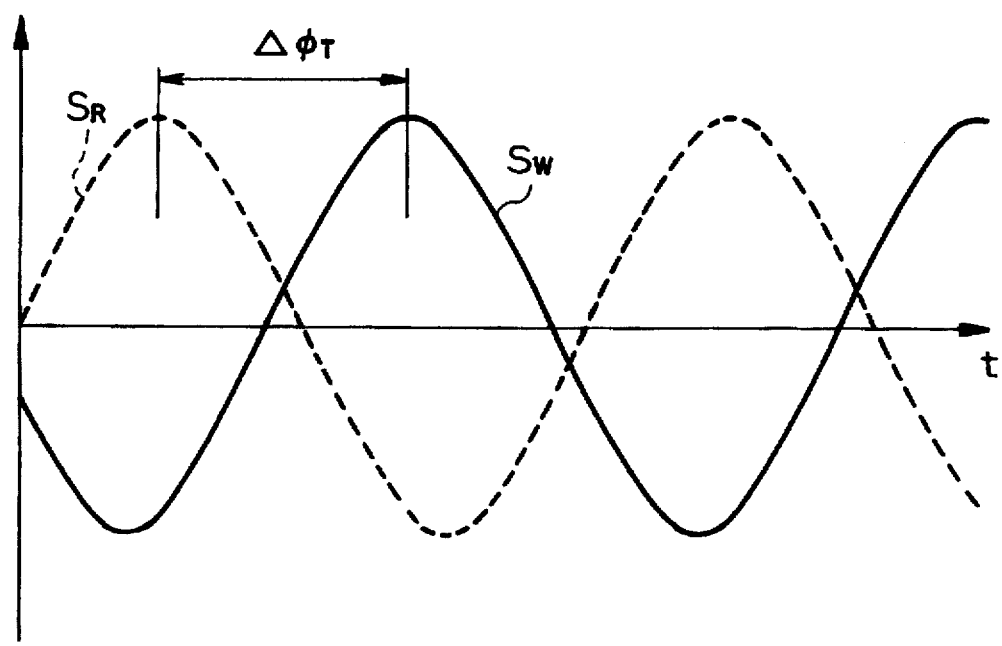
FIG. 12 is a waveform chart showing the phase relationship between two beat signals obtained by an alignment system of heterodyne interferometry type in the embodiment after the final alignment.

FIG. 12 shows a state where the phase difference $\Delta\phi_1$ between the two beat signals $S_R$ and $S_W$ (for the wafer beat signal $S_W$, the waveform after the signal has been amplified is shown in the figure) coincides with the target phase difference $\Delta\angle_T$.

Thereafter, at Step 112, the pattern formed on the reticle 4 is transferred to the shot area 47. In actual practice, during the exposure process also, the stage control is effected so that the phase difference $\Delta\phi_1$ coincides with the target phase difference $\Delta\phi_T$, to prevent occurrence of an alignment error due to vibration or the like.

According to the foregoing embodiment, AGC of the wafer beat signal $S_W$ is initiated from the time when the greater part of the alignment light beam has been irradiated to the alignment marks on the reticle 4 and the wafer 6 even if the amount of displacement between the reticle 4 and the wafer mark 48A has not yet reached a value within the range of ±¼ of the grating pitch $P_W$ of the wafer mark, which is a detectable range in the alignment system of heterodyne interferometry type, and the time was already terminated by the time when the amount of displacement between the reticle 4 and the wafer mark 48A reaches a value within the range of ±¼ of the grating pitch. Therefore, the time required for alignment can be shortened, and the throughput improves.

Further, since the wafer mark is larger in size than the alignment light beam, AGC can be initiated earlier. Moreover, when AGC is initiated, the wafer mark has already been generating diffracted light of the same intensity as is obtained when it reaches the design position. Therefore, AGC can be effected even more accurately.

Although in the foregoing embodiment the wafer mark 48A is larger than the irradiation region 54 of the alignment light beam 51 on the wafer 6 by $2\Delta L_1$ and $2\Delta L_2$ in the measuring and non-measuring directions, it should be noted that the alignment light beam 51 may be larger than the wafer mark 48A in reverse relation to the above.

Figure 15:
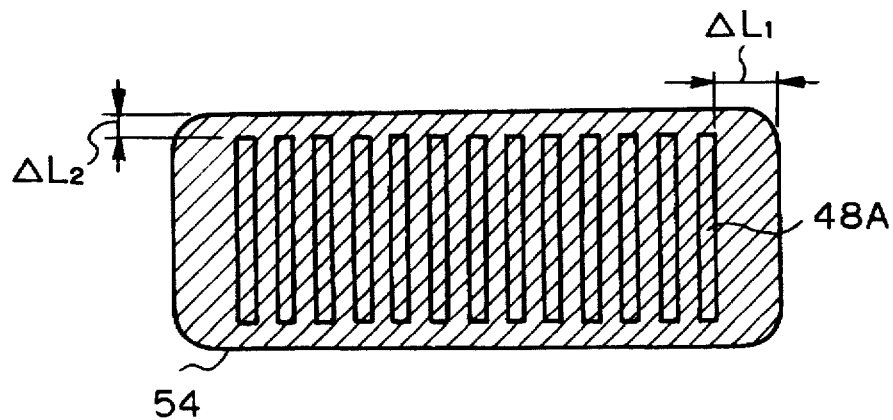
FIG. 15 is an enlarged plan view showing a modification of a wafer mark.
Figure 16:
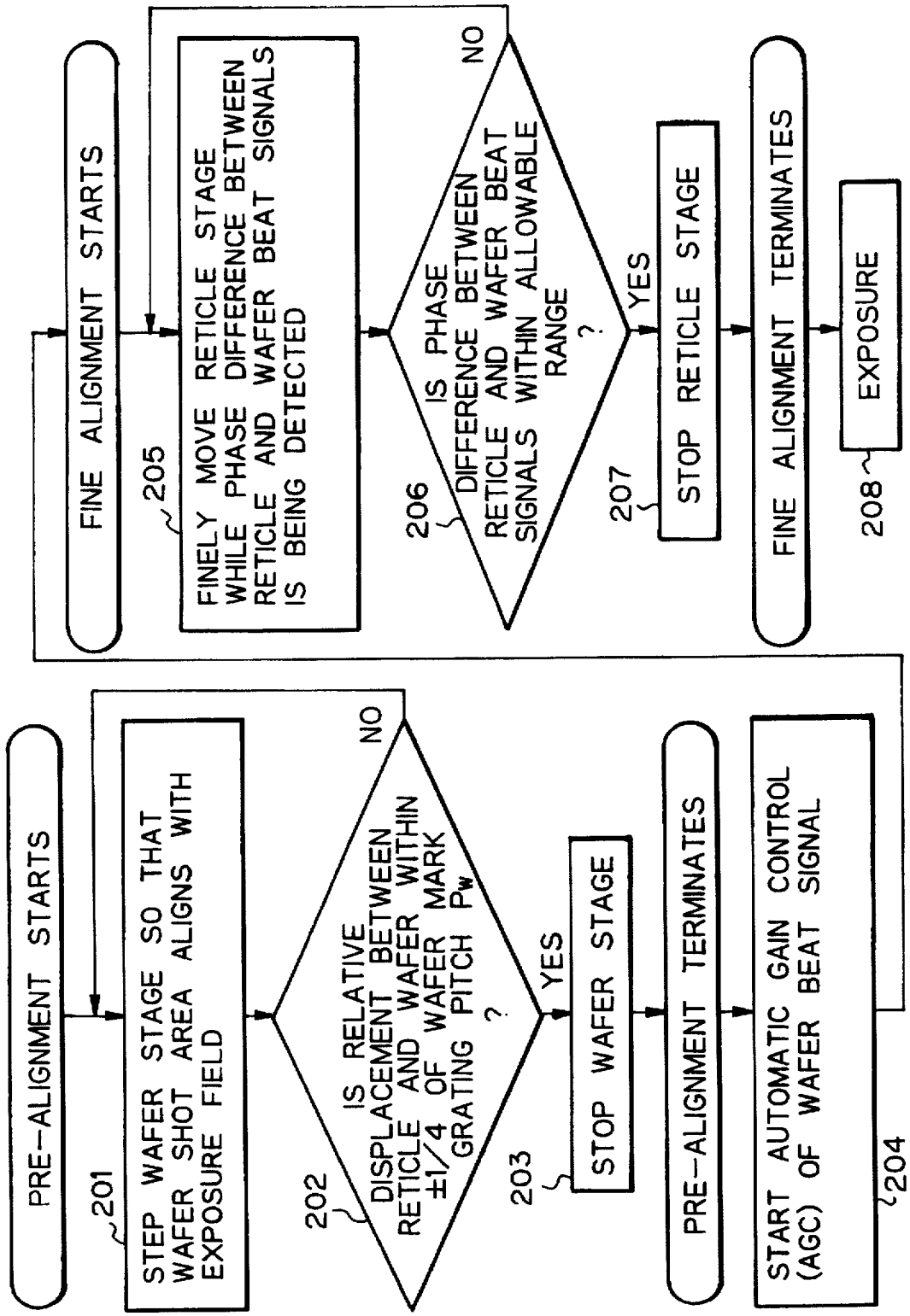
FIG. 16 is a flowchart showing one example of a conventional alignment method.

FIG. 15 shows a modification of a wafer mark. Referring to the figure, a wafer mark 48AA having a rectangular region as a whole is smaller than the irradiation region 54 of the alignment light beam 51 by $2\Delta L_1$ and $2\Delta L_2$ in the measuring direction and non-measuring direction which is perpendicular to the measuring direction. In this case, AGC is initiated when the displacement between the center of the wafer mark 48AA and the irradiation region 54 of the light beam 51 has reached a value within $\pm\Delta L_1$ in the measuring direction and a value within $\pm\Delta L_2$ in the non-measuring direction in the same way as in the foregoing embodiment. In this modification also, the adjustment of the amplification factor can be initiated before the wafer mark 48AA reaches a predetermined region. Further, since the greater part of the wafer mark 48AA has already been within the irradiation region 54 of the light beam 51 when the amplification factor adjustment is initiated, it is possible to adjust the amplification factor for the wafer beat signal $S_W$ even more accurately.

In the foregoing embodiment, the present invention is applied to a die-by-die alignment method in which alignment is effected every time exposure is carried out for each shot region. However, the present invention may also be applied to other alignment methods, for example, an enhanced global alignment process in which the positions of wafer marks are previously measured for each shot area (sample shot) selected from among a multiplicity of shot areas on the wafer 6, and alignment is carried out for each shot area on the basis of coordinates obtained by statistically processing the results of the measurement. Further, the present invention can be applied not only to TTR alignment systems but also to TTL or off-axis alignment systems.

Thus, the present invention is not necessarily limited to the foregoing embodiment, and various changes and modifications may be imparted thereto without departing from the gist of the present invention.

According to the alignment method of the present invention, an operation of determining an amplification factor in a variable amplifier is initiated as soon as a substrate mark (wafer mark) reaches a position at which the signal amplitude can be satisfactorily measured, before the amount of displacement between a reference mark (reticle mark) and the substrate mark reaches a value at which phase comparison can be made. Therefore, even if the beat signal from the substrate varies for each shot area of the substrate and hence it is necessary to change the amplification factor for the beat signal frequently, the adjustment of the amplification factor for the substrate beat signal has already terminated by the time when the substrate mark reaches a position at which phase comparison can be made. Accordingly, no extra time is needed for adjustment of the amplification factor for the substrate beat signal. Thus, the time required for alignment is shortened, and the throughput of the exposure process improves.

In a case where the size of the substrate mark differs from the irradiation region of two coherent light beams applied to the substrate by $2\Delta L_1$ in a measuring direction in which gratings constituting the substrate mark are arranged, and by $2\Delta L_2$ in a non-measuring direction which is perpendicular to the measuring direction, and where the adjustment of the amplification factor for the substrate beat signal is initiated after the displacement between the center of the substrate mark and the center of the irradiation region has reached a value within $\pm\Delta L_1$ in the measuring direction and a value within $\pm\Delta L_2$ in the non-measuring direction and before the amount of displacement between the reference mark and the substrate mark reaches a value at which phase comparison can be made, for example, in a case where substrate mark is larger in size than the irradiation region in both the measuring and non-measuring directions, the adjustment of the amplification factor can be initiated earlier, and when the adjustment is initiated, the substrate mark has already been generating diffracted light of the same intensity as is obtained when it reaches a predetermined region. Accordingly, it is possible to adjust the amplification factor even more accurately.

In a case where the substrate mark is smaller in size than the irradiation region of the two light beams in both the measuring and non-measuring directions also, it is possible to initiate the amplification factor adjustment before the substrate mark reaches a predetermined region, and when the amplification factor adjustment is initiated, the greater part of the substrate mark already been within the irradiation region of the two light beams. Therefore, the amplification factor for the substrate beat signal can be accurately adjusted.

In a case where the reference mark is a diffraction grating-shaped mask mark provided on the mask, an amount of displacement between the mask and the substrate can be directly detected without need of a special structure for providing reference gratings.

Further, the alignment apparatus of the present invention enables the above-described alignment method of the present invention to be directly carried out, and the throughput of the exposure process improves.

What is claimed is:

1. An alignment method for adjusting a relative position between a first mark on a first member and a second mark on a second member, said alignment method comprising steps of:

irradiating two coherent light beams having different frequencies to said first and second marks, respectively;

photoelectrically converting heterodyne beams produced by said first and second marks, respectively, to obtain first and second beat signals;

adjusting said second beat signal with a variable amplification factor;

comparing a phase difference between said first beat signal and said adjusted second beat signal; and initiating an adjusting operation of said second beat signal when the relative position between said first mark and said second mark is adjusted and before an amount of displacement between said first and second marks reaches a predetermined value.

2. An alignment method according to claim 1, further including a pre-alignment sensor for detecting relative positional displacement between said first and second marks, wherein the relative position between said first and second marks is adjusted on the basis of detected results by said pre-alignment sensor so that the amount of displacement between said first and second marks reaches said predetermined value.

3. An alignment method according to claim 1, said adjusting operation is initiated after an irradiation region of said two coherent light beams which are irradiated on said substrate overlaps with said substrate marks more than a predetermined degree.

4. An alignment method according to claim 1, wherein said second mark differs in size from the irradiation region of said two coherent light beams irradiated to said substrate by $2\Delta L_1$ in a measuring direction in which gratings constituting said second mark are arranged, and by $2\Delta L_2$ in a non-measuring direction which is perpendicular to said measuring direction, so that said irradiation region and said second mark overlap each other more than said predetermined degree when an amount of displacement between a center of said second mark and a center of said irradiation region reaches a value within $\pm\Delta L_1$ in the measuring direction and a value within $\pm\Delta L_2$ in the non-measuring direction.

5. An alignment method according to claim 1, wherein said first mark is a diffraction grating-shaped mark.

6. An alignment method according to claim 1, wherein said substrate mark is a diffraction grating-shaped mark.

7. An alignment method according to claim 4, wherein said substrate mark is a diffraction grating-shaped mark.

8. An alignment method for adjusting a relative position between a first mark on a first member and a second mark on a second member and a second mark on a second member, said alignment method comprising:

a first step of pre-aligning the relative position of said first mark and said second mark;

a second step of irradiating alignment lights to said first and second marks, respectively;

a third step of photoelectrically converting light returned from said second mark to obtain photoelectric signal;

a fourth step of adjusting the magnitude of said photoelectric signal; and a fifth step of bringing the amount of relative displacement between said first and second marks close to a predetermined target value on the basis of said photoelectric signal.

9. An alignment apparatus for adjusting a relative position between a first mark formed on a reticle and a second mark formed on a substrate, said alignment apparatus comprising:

an alignment system for irradiating two coherent light beams having different frequencies from each other to said first and second marks and photoelectrically converting heterodyne beams produced by said first and second marks, respectively, to obtain first and second beat signals;

an adjusting device for adjusting said second beat signal with a variable amplification factor;

a comparator for comparing the phase difference between said first beat signal and said adjusted second beat signal; and a controller for initiating an adjusting operation of said second beat signal when the relative position between said first mark and said second mark is adjusted and before an amount of displacement between said first and second marks reaches a predetermined value.

10. An exposure method for projecting a pattern on a mask onto a substrate, said exposure method comprising steps of:

irradiating two coherent light beams having different frequencies from each other to a first mark formed on said mask and a second mark formed on said substrate, respectively;

photoelectrically converting heterodyne beams produced by said first and second marks, respectively, to obtain first and second beat signals;

adjusting said second beat signal with a variable amplification factor;

comparing a phase difference between said first beat signal and said adjusted second beat signal; and initiating an adjusting operation of said second beat signal when the relative position between said first mark and said second mark is adjusted and before an amount of displacement between said first and second marks reaches a predetermined value.

11. An exposure method according to claim 10, wherein said first mark is a mask mark formed on said mask.

12. An exposure apparatus for projecting a pattern on a mask onto a substrate, said exposure apparatus comprising:

an alignment system for irradiating two coherent light beams having different frequencies from each other to said first mark formed on said mask and second mark formed on said substrate and photoelectrically converting heterodyne beams produced by said first and second marks, respectively, to obtain first and second beat signals;

an adjusting device for adjusting said second beat signal with a variable amplification factor;

a comparator for comparing the phase difference between said first beat signal and said adjusted second beat signal; and a controller for initiating an adjusting operation of said second beat signal when the relative position between said first mark and said second mark is adjusted and before an amount of displacement between said first and second marks reaches a predetermined value.

13. An exposure apparatus according to claim 12, wherein said first mark is a mask mark formed on said mask.

14. An alignment method for adjusting a relative position between a first mark on a first object and a second mark on a second object, said alignment method comprising:

roughly aligning said first and second objects;

irradiating two coherent light beams to said first mark in two different directions, said two light beams having different frequencies, respectively;

irradiating two coherent light beams to said second mark in two different directions, said two light beams having different frequencies, respectively;

photoelectrically converting a heterodyne beam produced by said first mark to obtain a first beat signal;

photoelectrically converting a heterodyne beam produced by said second mark to obtain a second beat signal;

detecting a phase difference between said first beat signal and the adjusted second beat signal;

adjusting relative positions between said first and second objects based on said phase difference; and adjusting said second beat signal with a variable amplification factor after initiation of rough alignment of said first and second objects and before detection of said phase difference.

15. An alignment method for adjusting a relative position between a first mark on a first object and a second mark on a second object, said alignment method comprising:

irradiating two coherent light beams to said first mark in two different directions, said two light beams having different frequencies, respectively;

irradiating two coherent light beams to said second mark in two different directions, said two light beams having different frequencies, respectively;

photoelectrically converting a heterodyne beam produced by said second mark to obtain a second beat signal;

detecting a phase difference between said first beat signal and the adjusted second beat signal;

adjusting relative positions between said first and second objects based on said phase difference; and adjusting said second beat signal with a variable amplification factor by using said second beat signal from said second object before detection of said phase difference.

* * * * *